US009997507B2

(12) United States Patent
Kashyap et al.

(10) Patent No.: US 9,997,507 B2
(45) Date of Patent: *Jun. 12, 2018

(54) SEMICONDUCTOR ASSEMBLY AND METHOD OF MANUFACTURE

(71) Applicant: General Electric Company, Schenectady, NY (US)

(72) Inventors: Avinash Srikrishnan Kashyap, Niskayuna, NY (US); Peter Micah Sandvik, Niskayuna, NY (US); Rui Zhou, Niskayuna, NY (US); Peter Almern Losee, Clifton Park, NY (US)

(73) Assignee: General Electric Company, Schenectady ( * ) Notice: Subject to any disclaimer, the term of this patent is extended or adjusted under 35 U.S.C. 154(b) by 395 days.

This patent is subject to a terminal disclaimer.

(21) Appl. No.: 13/950,736

(22) Filed: Jul. 25, 2013

(65) Prior Publication Data

US 2015/0028469 A1 Jan. 29, 2015

(51) Int. Cl.
*H01L 29/76* (2006.01)
*H01L 21/8252* (2006.01)
(Continued)

(52) U.S. Cl.
CPC .. *H01L 27/0248* (2013.01); *H01L 2924/0002* (2013.01)

(58) Field of Classification Search
CPC ............. H01L 27/115; H01L 27/11521; H01L 21/28273; H01L 27/0605; H01L 21/8258; H01L 29/8618; H01L 21/8252
(Continued)

(56) References Cited

U.S. PATENT DOCUMENTS 6,015,999 A * 1/2000 Yu .................. H01L 29/8618
257/361
6,489,660 B1 * 12/2002 Einthoven ........... H01L 29/8618
257/361
(Continued)

FOREIGN PATENT DOCUMENTS

EP 2546880 A2 1/2013
EP 2819156 A2 12/2014
(Continued)

OTHER PUBLICATIONS

"Transient Suppression Devices and Principles" Application Note, AN9768, Littelfuse, Jan. 1998, pp. 10-102 to 10-109.
(Continued)

*Primary Examiner* — Matthew Reames
*Assistant Examiner* — Young Kim
(74) *Attorney, Agent, or Firm* — Global Patent Operation; John P. Darling

(57) ABSTRACT

A monolithically integrated semiconductor assembly is presented. The semiconductor assembly includes a substrate including silicon (Si), and gallium nitride (GaN) semiconductor device is fabricated on the substrate. The semiconductor assembly further includes at least one transient voltage suppressor (TVS) structure fabricated in or on the substrate, wherein the TVS structure is in electrical contact with the GaN semiconductor device. The TVS structure is configured to operate in a punch-through mode, an avalanche mode, or combinations thereof, when an applied voltage across the GaN semiconductor device is greater than a threshold voltage. Methods of making a monolithically integrated semiconductor assembly are also presented.

10 Claims, 4 Drawing Sheets

(51) Int. Cl.
*H01L 21/8258* (2006.01)
*H01L 27/02* (2006.01)

(58) Field of Classification Search
USPC .. 257/E21.502, E23.114, E29.008, E29.082, 257/E29.068, 76, 77, 191, 192, 194, 195, 257/124, 173, 314, 660, 734, 774, 134, 257/E21.697, 361; 438/121, 124, 127, 438/478, 328
See application file for complete search history.

(56) References Cited

U.S. PATENT DOCUMENTS

| | | | |
|---|---|---|---|
| 6,600,204 | B2 | 7/2003 | Einthoven et al. |
| 6,703,284 | B2 * | 3/2004 | Barkhordarian .... H01L 21/8252 257/E21.697 |
| 7,358,540 | B2 | 4/2008 | Hsieh et al. |
| 7,579,632 | B2 | 8/2009 | Salih et al. |
| 7,732,837 | B2 | 6/2010 | Saito et al. |
| 7,884,395 | B2 | 2/2011 | Saito |
| 8,124,981 | B2 | 2/2012 | Rexer et al. |
| 8,314,447 | B2 | 11/2012 | Hirler et al. |
| 8,390,030 | B2 | 3/2013 | Saito et al. |
| 8,530,902 | B2 | 9/2013 | Kashyap et al. |
| 8,772,827 | B2 | 7/2014 | Yoshimochi |
| 8,816,395 | B2 | 8/2014 | Bunin et al. |
| 9,012,959 | B2 | 4/2015 | Fujita |
| 2006/0126238 | A1 | 6/2006 | Goudo |
| 2007/0228401 | A1 | 10/2007 | Machida et al. |
| 2008/0042143 | A1 | 2/2008 | Yedinak et al. |
| 2010/0230722 | A1 | 9/2010 | Chang et al. |
| 2010/0237356 | A1 | 9/2010 | Haney et al. |
| 2010/0265978 | A1 | 10/2010 | Katoda |
| 2011/0260174 | A1 | 10/2011 | Hebert |
| 2011/0260216 | A1 * | 10/2011 | Hebert ............... H01L 21/8258 257/194 |
| 2012/0218783 | A1 | 8/2012 | Imada |
| 2013/0015499 | A1 | 1/2013 | Briere |
| 2013/0105816 | A1 | 5/2013 | Kashyap et al. |
| 2013/0163139 | A1 | 6/2013 | Kashyap et al. |
| 2013/0258541 | A1 | 10/2013 | Knobloch et al. |
| 2014/0054601 | A1 | 2/2014 | Ritenour |

FOREIGN PATENT DOCUMENTS

| | | |
|---|---|---|
| JP | 0766405 A | 3/1995 |
| JP | 2005502190 A | 1/2005 |
| JP | 2006351691 A | 12/2006 |
| JP | 2008258419 A | 10/2008 |
| JP | 20080277641 A | 11/2008 |
| JP | 2009009993 A | 1/2009 |
| JP | 2009049265 A | 3/2009 |
| JP | 2009064883 A | 3/2009 |
| JP | 2010080618 A | 4/2010 |
| JP | 2013016627 A | 1/2013 |
| JP | 2013033931 A | 2/2013 |
| JP | 20130026249 A | 2/2013 |
| JP | 2013093574 A | 5/2013 |
| JP | 2014236153 A | 12/2014 |
| KR | 2013031761 A | 3/2013 |

OTHER PUBLICATIONS

N. Otsuka et al.,"GaN Power Electron Devices", Abstract #2170, 220th ECS Meeting, 2011 The Electrochemical Society, Semiconductor Company and Advanced Technology Research Laboratories, 1 Page.

Huang et al., "Ruggedness Analysis of 600V 4H-Sic JBS Diodes Under Repetitive Avalanche Conditions", Applied Power Electronics Conference and Exposition (APEC), 2012 Twenty-Seventh Annual IEEE, Issue Date: Feb. 5-9, 2012, Print ISBN: 978-1-4577-1215-9, pp. 1688-1691.

Pengelly et al.,"A Review of GaN on SiC High Electron-Mobility Power Transistors and MMICs", IEEE Transactions on Microwave Theory and Techniques, vol. 60, No. 6, Jun. 2012, 20 Pages.

Meneghini et al.,"Analysis of the Reliability of AlGaN/GaN HEMTs Submitted to On-State Stress Based on Electroluminescence Investigation", IEEE Transactions on Device and Materials Reliability, Jun. 2013, vol. 13, No. 2, pp. 357-361.

Combined Search and Examination Report issued in connection with corresponding GB Application No. GB1413054.6 dated Jan. 26, 2015.

European Search Report and Opinion issued in connection with corresponding EP Application No. 14174706.3 dated Apr. 16, 2015.

Japanese Office Action issued in connection with corresponding JP Application No. 2014130906 dated Apr. 14, 2015 (for related U.S. Appl. No. 13/931,363).

Unofficial English translation of Japanese Office Action issued in connection with corresponding JP Application No. 2014145494 dated Jul. 28, 2015.

Unofficial English translation of Taiwan Office Action issued in connection with corresponding TW Application No. 103121893 dated Aug. 18, 2015.

Unofficial translation of Japanese Office Action dated Jun. 28, 2016 in connection to corresponding JP Application 2014-145494.

Unofficial English Translation of Japanese Office Action issued in connection with corresponding JP Application No. 2014145494 dated Jul. 4, 2017.

* cited by examiner

US 9,997,507 B2

SEMICONDUCTOR ASSEMBLY AND METHOD OF MANUFACTURE

BACKGROUND OF THE INVENTION

The invention relates generally to over-voltage protection of gallium nitride (GaN)-based semiconductor devices, and, more particularly, to over-voltage protection of GaN-based transistors.

GaN-semiconductor devices, such as, field effect transistors (FETs), in particular, high electron mobility field effect transistors (HEMTs) have found applications across industries, such as, medical, defense, aviation etc. However, GaN devices are susceptible to electrical overstresses due to transient events in the circuit and electro-static discharge (ESD). The electrical stresses can induce avalanching in the device that can lead to device degradation and eventually catastrophic failure. While GaN switches have several advantages, this safety consideration (due to a lack of sustainable avalanching) has precluded their widespread deployment in high speed switching and power electronic systems.

GaN-based devices, in particular transistors, have been unable to demonstrate sustained avalanche due to defects in the crystal. Defects arising from the growth of GaN materials on foreign substrates such as silicon (Si), sapphire, silicon carbide (SiC) or other materials are observed in high densities (greater than 1000 per square centimeter), leading to the GaN material's inability to maintain a stable avalanche condition, leading the GaN material to degrade physically, and irreversibly.

Accordingly, there is a need for overvoltage protection of GaN devices to preclude avalanche conditions. Further, it may be desirable to provide overvoltage protection of GaN devices during high temperature operation (greater than 150 degrees Celsius).

BRIEF DESCRIPTION OF THE INVENTION

One aspect of the present technique is directed to a monolithically integrated semiconductor assembly. The semiconductor assembly includes a substrate comprising Si, and a GaN semiconductor device fabricated on the substrate. The semiconductor assembly further includes at least one transient voltage suppressor (TVS) structure fabricated in or on the substrate, wherein the TVS structure is in electrical contact with the GaN semiconductor device. The TVS structure is configured to operate in a punch-through mode, an avalanche mode, or combinations thereof, when an applied voltage across the GaN semiconductor device is greater than a threshold voltage.

Another aspect of the present technique is directed to a monolithically integrated semiconductor assembly. The semiconductor assembly includes a substrate comprising Si, and a GaN semiconductor device fabricated on the substrate. The semiconductor assembly further comprises at least one TVS structure comprising Si fabricated in or on the substrate. The TVS structure is in electrical contact with the GaN semiconductor device, and the TVS structure is configured to operate in a punch-through mode, when an applied voltage across the GaN semiconductor device is greater than a threshold voltage.

Another aspect of the present technique is directed to a method of making a monolithically integrated semiconductor assembly. The method includes (a) providing a substrate comprising Si; (b) fabricating a GaN semiconductor device on the substrate; (c) fabricating at least one TVS in or on the substrate; and (d) electrically coupling the TVS structure with the GaN semiconductor device. The TVS structure is configured to operate in a punch-through mode, an avalanche mode, or combinations thereof, when an applied voltage across the GaN semiconductor device is greater than a threshold voltage.

DRAWINGS

These and other features, aspects, and advantages of the present invention will become better understood when the following detailed description is read with reference to the accompanying drawings, in which like characters represent like parts throughout the drawings, wherein.

DETAILED DESCRIPTION

As discussed in detail below, certain embodiments of the invention include monolithically integrated semiconductor assemblies including a GaN-semiconductor device and a TVS structure.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a region) being present and includes instances in which a combination of the referenced components may be present, unless the context clearly dictates otherwise.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise.

As used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer/device is being described as "on" another layer or substrate, it is to be understood that the layers/devices can either be directly contacting each other or have one (or more) layer or feature between the layers and devices. Further, the term "on" describes the relative position of the layers/devices to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

Figure 1:
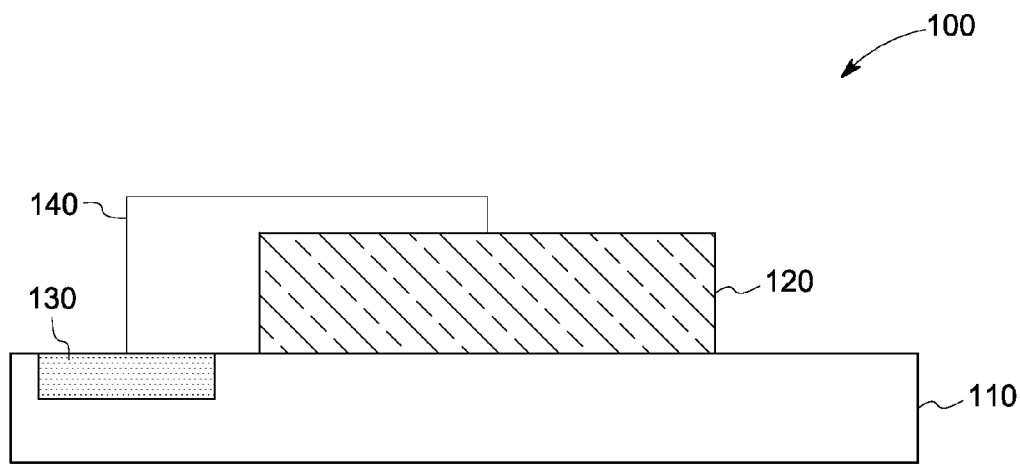
FIG. 1 is a cross-sectional view of a semiconductor assembly, in accordance with certain embodiments of the invention.
Figure 2:
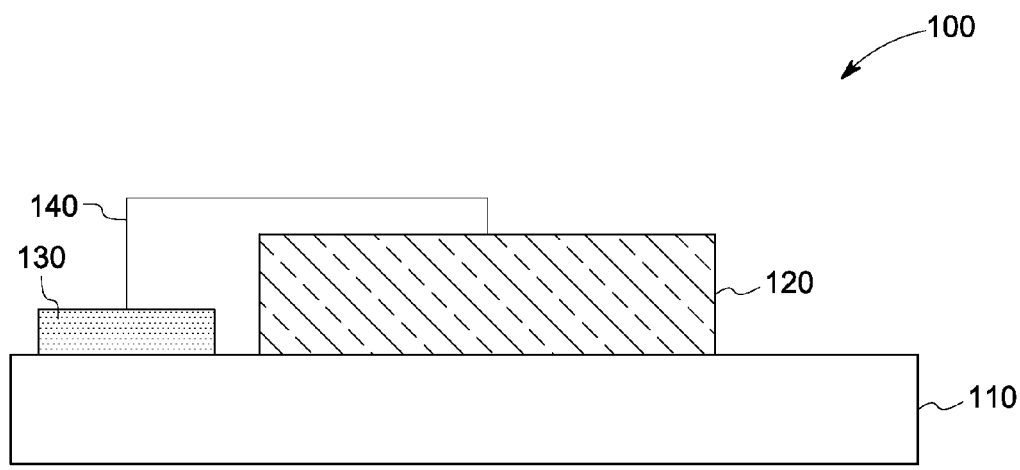
FIG. 2 is a cross-sectional view of a semiconductor assembly, in accordance with certain embodiments of the invention.

As described in detail later, a monolithically integrated semiconductor assembly is presented. The term "monolithically integrated" as used herein refers to a semiconductor assembly having all components manufactured/fabricated into or on top of a single substrate. FIGS. 1 and 2 schematically represent a monolithically integrated semiconductor assembly 100, in accordance with some embodiments of the invention. As illustrated in FIGS. 1 and 2, the semiconductor assembly 100 includes a substrate 110 and a gallium nitride (GaN) semiconductor device 120 is fabricated on the substrate 110. The semiconductor assembly further includes at least one transient voltage suppressor (TVS) structure 130. The TVS structure may be fabricated in the substrate, as illustrated in FIG. 1, or, alternatively, the TVS structure may be fabricated on the substrate, as illustrated in FIG. 2. The TVS structure 130 is in electrical contact 140 with the GaN semiconductor device 120, as indicated in FIGS. 1 and 2.

For the sake of brevity, the terms "gallium nitride semiconductor device" and "GaN device" are used herein interchangeably. Further, the terms "transient voltage suppressor structure" and "TVS structure" are used herein interchangeably.

In accordance with one embodiment of the invention, the substrate comprises silicon (Si). Beneficially, the use of a Si substrate may provide a more economical and cost-effective option for GaN devices.

The semiconductor assembly may include any suitable GaN device 120 based on the end-use application of the assembly. For particular configurations, the GaN device 120 includes a GaN transistor, a GaN diode, or combinations thereof. Suitable non-limiting example of a GaN transistor include a field effect transistor (FET), such as, for example, a high electron mobility transistor (HEMT), a junction gate field effect transistor (JFET), a metal-oxide-semiconductor field-effect transistor (MOSFET), or combinations thereof. One or more of the GaN devices 120 may be fabricated on the substrate 110 in a lateral configuration or a vertical configuration. For particular configurations, the GaN device 120 is a HEMT.

Figure 3:
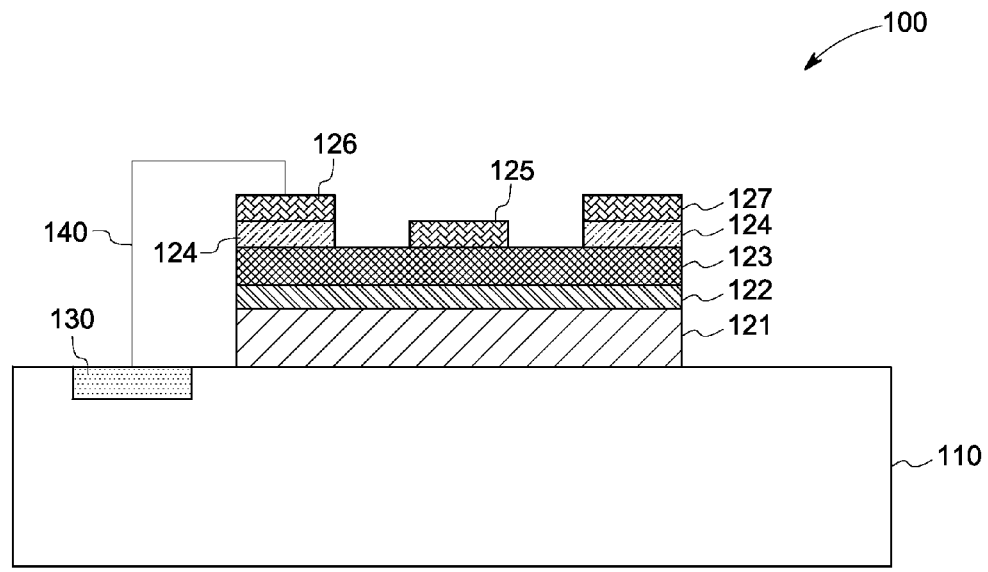
FIG. 3 is a cross-sectional view of a semiconductor assembly, in accordance with certain embodiments of the invention.

Referring now to FIG. 3, a schematic view of an exemplary GaN HEMT device 120 is illustrated. The exemplary HEMT device 120, as illustrated in FIG. 3, optionally includes a buffer layer 121 disposed on the Si substrate 110. For particular configurations, one or more intervening layers (not shown) may be disposed between the buffer layer 121 and the Si substrate. For the configuration shown in FIG. 3, a GaN layer 122 is disposed on the buffer layer 121, and an aluminum gallium nitride (AlGaN) layer 123 is disposed on the GaN layer 122.

For the illustrated arrangement, the HEMT device 120 further includes a gate terminal 125, a source terminal 126, and a drain 127 terminal, as indicated in FIG. 3. In some configurations, the GaN layer 122 and the AlGaN layer 123 are intrinsic-type (i-type) and an additional p-type AlGaN layer (not shown) may be disposed between the AlGaN layer 123 and the gate terminal 126. A capping layer 124 (optional) may be further interposed between the source terminal 125/drain terminal 127 and the AlGaN layer 123. The GaN HEMT device 120 may be fabricated on the Si substrate 110 by sequentially disposing or forming one or more of the aforementioned layers.

Figure 7:
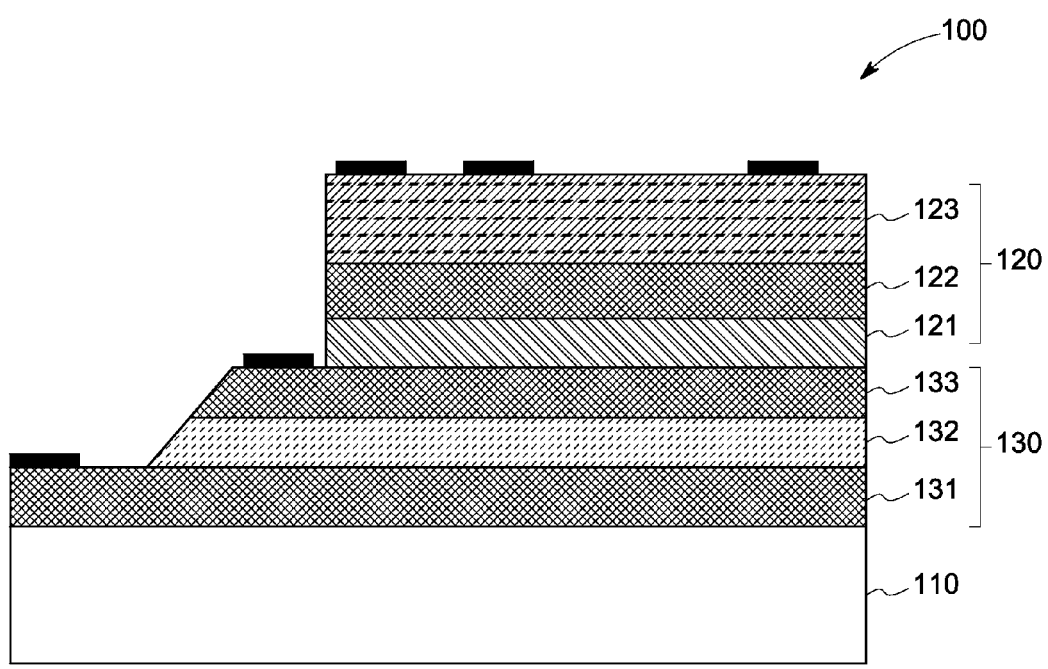
FIG. 7 is a cross-sectional view of a semiconductor assembly, in accordance with certain embodiments of the invention.

The terms "fabricated on" or "fabricating on" as used herein means that the GaN device 120/TVS structure 130 may be fabricated directly in contact with at least a portion of the substrate 110, or, alternatively, one or more layers/features may be interposed between the GaN devices 120/TVS structure 130 and the substrate 110. For particular configurations, the GaN device 120 may be fabricated on one or more intervening layers or features, which are further disposed on at least a portion of the substrate 110. For example, in some configurations, the GaN device 120 may be fabricated on at least a portion of a TVS structure 130 disposed on the substrate, as illustrated in FIG. 7 (described in detail later).

As noted earlier, a transient voltage suppressor (TVS) structure, also referred to as a surge protector, is an electronic component that is utilized for protecting sensitive electronics from damage such as voltage spikes. A transient or excess voltage (or current) is a momentary or fleeting surge in the voltage (or current) that may harm sensitive electronic circuitry. Hereinafter, the terms "voltage surge" and "transient voltage" may be used interchangeably to indicate an unexpected or excessive increase in voltage compared to an average voltage across the system. Similarly, the terms "current surge" and "transient current" may be used interchangeably to indicate an unexpected increase in the current compared to an average current transmitted through the system. Hereinafter, the term "transients" may be used to generically refer to transient voltage or transient current.

In general, a transient voltage suppressor device operates on two principles: attenuating excess current or transient current thereby limiting residual current, or diverting a transient or an excess current from the sensitive electronic components. Attenuating a transient current is typically achieved by ensuring that the transient current does not reach or impact the sensitive electronic components, often by using filters inserted in series with the electronic components. Diverting a transient current is typically achieved by using a voltage clamping device or a crowbar type device. In operation, the voltage clamping device has variable impedance that varies in response to the current flowing through the voltage clamping device.

For particular configurations, the TVS structure 130 may be a clamping device. More particularly, the TVS structure 130 may be configured to operate in a punch-through mode, an avalanche mode, or combinations thereof, when an applied voltage across the GaN device 120 is greater than a threshold voltage.

The term "punch-through mode" as used herein means that TVS structure operates using "punch-through," or also known as, "reach-through" physics, such that, as the voltage across the TVS structure is increased, a depletion region extends across the structure, and large amounts of current are able to flow through the TVS structure. The TVS structure is further able to maintain this condition with minimal change in the voltage across it.

The term "avalanche mode" as used herein refers to the process in which semiconductors sustain an electrical field internal to a region or regions of the device, whereby the process of ionization starts to occur, leading to carrier multiplication. The TVS structures may maintain this condition if so desired, however, this typically involves a non-linear increase in current, above the turn-on voltage of the device, and may see large increases in current and therefore heat in the device in these conditions. The term threshold voltage as used herein refers to the voltage at which the TVS device will effectively turn on, or begin to conduct current.

As noted, the TVS structure 130 includes silicon, either, from the original substrate material or regrown epitaxy material. The TVS structure 130 may be configured laterally, or, alternatively, vertically in the semiconductor assembly 100. FIGS. 3-6 illustrate exemplary configurations in which the TVS structure 130 is configured laterally. FIG. 7 illustrates an exemplary configuration in which the TVS structure 130 is configured vertically.

Referring again to FIGS. 3-7, an exemplary TVS structure 130 includes a first semiconductor region 131 having a first conductivity type, and a second semiconductor region 132 having a second conductivity type and in electrical contact with the first semiconductor region. The TVS structure 130 further includes a third semiconductor region 133 having a first conductivity type, and in electrical contact with the second semiconductor region 132.

For particular configurations, the first conductivity is p-type and the second conductivity is n-type. In such instances, the TVS structure comprises a p-n-p device. For other arrangements, the first conductivity is n-type and the second conductivity is n-type. In such instances, the TVS structure comprises an n-p-n device.

It should be noted herein that the conductivity of a semiconductor material is indicative of the majority and minority charge carriers in the semiconductor material. For example, an n-type semiconductor material includes "negative charge carriers" as majority charge carriers and "positive charge carriers" as minority charge carriers. For example, a p-type semiconductor material includes "negative charge carriers" as minority charge carriers and "positive charge carriers" as majority charge carriers. As is understood by one of ordinary skilled in the art, a "negative charge carrier" refers to electrons whereas a "positive charge carriers" refers to holes.

For particular configurations, the first conductivity type is n+-type and the second conductivity type is p--type. In an n-p-n type device, when the device is subjected to a potential across the two n-type layers, a depletion layer is formed (mostly) in the p-type layer because its doping is much lower compared to the two n-type layers. For example, one to five orders of magnitude lower, or one-tenth to one ten-thousandth of the dopant concentration of the n-type layers. For a further example, if the doping concentration in the n-type layers is about $10^{18}/cm^3$, the doping concentration in the p-type layers would be about $10^{15}/cm^3$.

As the voltage across the device is increased, the depletion region extends all across the p-type layer and touches the n-type layer on the other side. This leads to the mode known as "punch-through" as discussed earlier, and a large amount of current begins flowing in the device. The device is able to maintain this condition with minimal change in the voltage across it. A similar explanation describes the operation mode when the polarity of the layers is changed to p-n-p. The avalanche structure may be similar to the punch through structure illustrated in FIGS. 3-7. By adjusting the thickness and doping of the second semiconductor region 132, the TVS structure 130 may be made to work in the avalanche mode instead of punch through mode.

Figure 4:
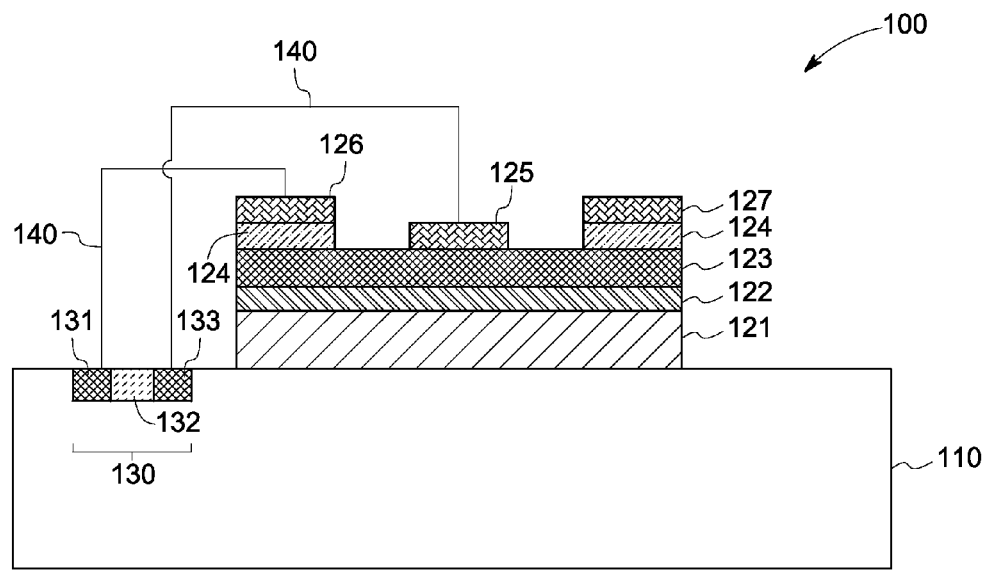
FIG. 4 is a cross-sectional view of a semiconductor assembly, in accordance with certain embodiments of the invention.
Figure 5:
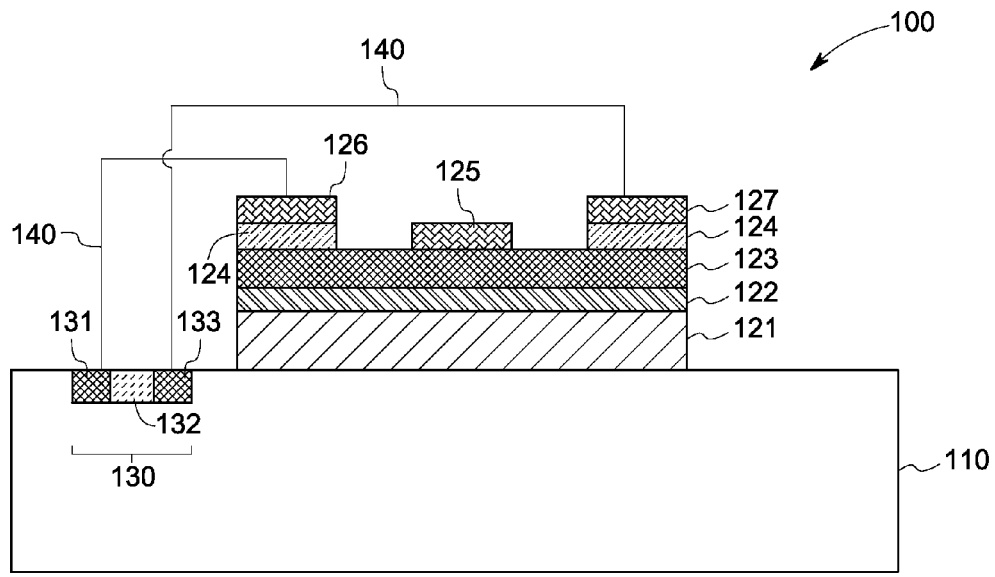
FIG. 5 is a cross-sectional view of a semiconductor assembly, in accordance with certain embodiments of the invention.

As noted earlier, the TVS structure 130 is in electrical contact 140 with the GaN device 120. For particular configurations, the TVS structure 130 is in electrical contact with the GaN device 120 via a gate-source terminal, a drain-source terminal, a gate-drain terminal, or combinations thereof. FIG. 4 illustrates an arrangement in which the first semiconductor region 131 is in electrical contact 140 with a source terminal 126 of the GaN device 130, and the third semiconductor region 133 is in electrical contact with a gate terminal 125 of the GaN device 120. FIG. 5 illustrates an alternate arrangement in which the first semiconductor region 131 is in electrical contact 140 with a source terminal 126 of the GaN device 130, and the third semiconductor region 133 is in electrical contact with a drain terminal 127 of the GaN device 120.

Figure 6:
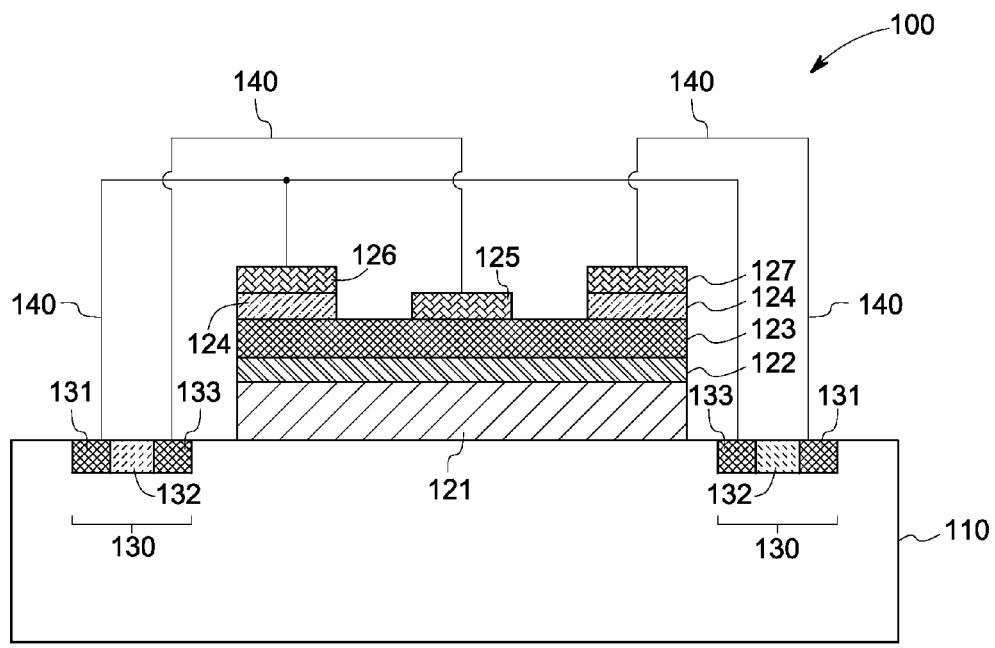
FIG. 6 is a cross-sectional view of a semiconductor assembly, in accordance with certain embodiments of the invention.

Further, in some configurations, the semiconductor assembly may include multiple TVS structures 130. FIG. 6 illustrates an arrangement including two TVS structures 130. In such instances, the two TVS structures may be electrically connected to the same terminals in the GaN device 120 or to different terminals. FIG. 6 illustrates a configuration in which a first TVS structure 130 is electrically connected to the source terminal 126 and gate terminal 125 of the GaN device 120. The second TVS structure is electrically connected to the source terminal 126 and the drain terminal 127. For particular configurations, the GaN device 120 may be surrounded by a series of rings, including the TVS structure 130, to accommodate larger currents.

For particular configurations, the first semiconductor region 131, the second semiconductor region 132, and the third semiconductor region 133 are formed in the Si substrate 110, as illustrated in FIGS. 4-6. In such instances, the first semiconductor region 131, the second semiconductor region 132, and the third semiconductor region 133 may be formed in the Si substrate 110 using any suitable technique, for example, diffusion of n-type dopants or p-type dopants. Suitable non-limiting examples of p-type dopants include boron, aluminum, gallium, magnesium, carbon, calcium, or combinations thereof. Suitable non-limiting examples of n-type dopants include nitrogen, phosphorus, arsenic, antimony, or combinations thereof.

For particular configurations, the first semiconductor region 131, the second semiconductor region 132, and the third semiconductor region 133 are epitaxially grown on the Si substrate 110, as illustrated in FIG. 7. FIG. 7 illustrates a vertical configuration of the TVS structure 130. For the arrangement shown in FIG. 7, the semiconductor assembly 100 includes a mesa structure that includes a Si substrate (e.g., having an n+-type conductivity). The semiconductor assembly 100 further includes an epitaxially grown first semiconductor region 131 (e.g., having an n+-type conductivity), an epitaxially grown second semiconductor region 132 (e.g., having an p--type conductivity) in electrical contact with the first semiconductor region 131, and an epitaxially grown third semiconductor region 133 (e.g., having an n+-type conductivity) in electrical contact with the second semiconductor region 132.

For particular configurations, the second semiconductor region 132 is relatively lightly doped relative to the first semiconductor region 131 and the third semiconductor region 133. For particular configurations, a uniform doping concentration of substrate 110 and regions, 131, 132, and 133 improves a uniformity of the electric field distribution in the depletion region, thereby improving the breakdown voltage characteristic.

Moreover, in particular configurations, as illustrated in FIG. 7, the TVS structure may have a beveled sidewall. The beveled sidewall may be angled about five degrees to about eighty degrees with respect to an interface between adjacent contacting layers to reduce the maximum electric field profile at a surface of the assembly.

A method of making a monolithically integrated semiconductor assembly is also presented. Referring again to FIGS. 1 and 2, the method includes the steps of (c) providing a substrate 110 comprising silicon (Si); (b) fabricating a gallium nitride (GaN) semiconductor device 120 on the substrate 110; (c) fabricating at least one transient voltage suppressor (TVS) 130 in or on the substrate 110; and (d) electrically coupling the TVS structure 130 with the GaN semiconductor device 120. As noted earlier, the TVS structure 130 may be configured to operate in a punch-through mode, an avalanche mode, or combinations thereof, when an applied voltage across the GaN semiconductor device 120 is greater than a threshold voltage. It should be noted that the step (b) may be effected before step (c) in some processes, or, alternately, step (c) may be performed before (b) in some other processes.

The GaN device 120 may be fabricated on the Si substrate 110 by epitaxially growing one or more layers of the GaN device 120. For example, referring again to FIG. 3, in some configurations, the GaN device 120 may be fabricated by sequentially disposing or forming one or more of the layers 121, 122, and 123, and forming the source, gate, and drain terminals 125, 126, and 127.

The method may further optionally include fabricating the TVS structure 130 by forming a first semiconductor region 131 of a first conductivity type, as illustrated in FIGS. 4-7. The method further includes forming a second semiconductor region 132 of a second conductivity type, and in electrical contact with the first semiconductor region 131; and forming a third semiconductor region 133 of a first conductivity type, and in electrical contact with the second semiconductor region 132, as illustrated in FIGS. 4-7.

For particular configurations, the first conductivity is p-type and the second conductivity is n-type. In such instances, the TVS structure comprises a p-n-p device. For other configurations, the first conductivity is n-type and the second conductivity is n-type. In such instances, the TVS structure comprises an n-p-n device. For particular configurations, the first conductivity type is n+-type and the second conductivity type is p--type.

With continued reference to FIGS. 4-6, for particular processes, the step of forming the TVS structure may include forming the first semiconductor region 131, the second semiconductor region 132, and the third semiconductor region 133 in the Si substrate 130. In such instances, the TVS structure 130 may be formed using any suitable technique, such as, for example, diffusion.

For some other particular processes, as illustrated in FIG. 7, the step of forming the TVS structure 130 may include epitaxially growing the first semiconductor region 131, the second semiconductor region 132, and the third semiconductor region 133 on the Si substrate 110. As illustrated in FIG. 7, in such processes, the GaN device 120 is fabricated on the TVS structure 130 after the step of TVS fabrication on the Si substrate 110.

The method may further includes electrically coupling 140 the TVS structure 130 with a GaN semiconductor device 120 via a gate-source terminal, a drain-source terminal, a gate-drain terminal, or combinations thereof, as illustrated in FIGS. 4-7.

The above-described semiconductor assemblies provide a cost-effective and reliable means for overvoltage protection of GaN devices to preclude avalanche conditions.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A monolithically integrated semiconductor assembly, comprising:
    a substrate comprising silicon (Si);
    a gallium nitride (GaN) semiconductor device fabricated on the substrate; and
    at least one transient voltage suppressor (TVS) structure fabricated in the substrate, the TVS structure comprising
        a first semiconductor region having a first conductivity type,
        a second semiconductor region having a second conductivity type, and in physical electrical contact with the first semiconductor region, and a third semiconductor region having the first conductivity type, and in physical electrical contact with the second semiconductor region,
    wherein the TVS structure is in electrical contact with the GaN semiconductor device, and wherein the TVS structure is configured to operate in a punch-through mode when an applied voltage across the GaN semiconductor device is greater than a threshold voltage.

2. The semiconductor assembly of claim 1, wherein the TVS structure is configured laterally.

3. The semiconductor assembly of claim 1, wherein the TVS structure is configured vertically.

4. The semiconductor assembly of claim 1, wherein the first conductivity type is n+-type and the second conductivity type is p-type.

5. The semiconductor assembly of claim 1, wherein the first semiconductor region, the second semiconductor region, and the third semiconductor region are formed in the Si substrate.

6. The semiconductor assembly of claim 1, wherein the first semiconductor region, the second semiconductor region, and the third semiconductor region are epitaxially grown on the Si substrate.

7. The semiconductor assembly of claim 1, wherein the TVS structure further comprises a GaN layer disposed on at least a portion of the Si substrate, and the first semiconductor region, the second semiconductor region, and the third semiconductor region are formed in the GaN layer.

8. The semiconductor assembly of claim 1, wherein the TVS structure is in electrical contact with the GaN semiconductor device via a gate-source terminal, a drain-source terminal, a gate-drain terminal, or combinations thereof.

9. The semiconductor assembly of claim 1, wherein the GaN semiconductor device comprises a high electron mobility transistor (HEMT), a junction gate field effect transistor (JFET), a metal-oxide-semiconductor field-effect transistor (MOSFET), a diode, or combinations thereof.

10. A method of making a monolithically integrated semiconductor assembly comprising:
  (a) providing a substrate comprising silicon (Si);
  (b) fabricating a gallium nitride (GaN) semiconductor device on the substrate;
  (c) fabricating at least one transient voltage suppressor (TVS) structure in the substrate, the TVS structure comprising
    a first semiconductor region having a first conductivity type,
    a second semiconductor region having a second conductivity type, and in physical electrical contact with the first semiconductor region, and a third semiconductor region having the first conductivity type, and in physical electrical contact with the second semiconductor region; and
  (d) electrically coupling the TVS structure with the GaN semiconductor device,
  wherein the TVS structure is in electrical contact with the GaN semiconductor device, and wherein the TVS structure is configured to operate in a punch-through mode when an applied voltage across the GaN semiconductor device is greater than a threshold voltage.

* * * * *